United States Patent [19]

Kraft et al.

[11] Patent Number: 4,488,067
[45] Date of Patent: Dec. 11, 1984

[54] TRISTATE DRIVER CIRCUIT WITH LOW STANDBY POWER CONSUMPTION

[75] Inventors: Wayne R. Kraft, Coral Springs; Victor S. Moore, Gainesville; William L. Stahl, Jr., Coral Springs; Nandor G. Thoma, Boca Raton, all of Fla.

[73] Assignee: International Business Machines Corporation, Armonk, N.Y.

[21] Appl. No.: 533,392

[22] Filed: Sep. 19, 1983

[51] Int. Cl.³ .................. H03K 19/094; H03K 19/20; H03K 19/017
[52] U.S. Cl. ..................................... 307/473; 307/450
[58] Field of Search ............... 307/443, 450, 473, 270; 364/716

[56] References Cited

U.S. PATENT DOCUMENTS

| | | | |
|---|---|---|---|
| 4,037,114 | 7/1977 | Stewart et al. | 307/473 |
| 4,380,709 | 4/1983 | Au | 307/473 |
| 4,425,517 | 1/1984 | Smith | 307/473 |

FOREIGN PATENT DOCUMENTS 62546 10/1982 European Pat. Off. ............ 307/473

OTHER PUBLICATIONS

Burke, "Bipolar Three-State Driver", IBM Tech. Discl. Bull.; vol. 21, No. 7, pp. 2905-2906; 12/78.

*Primary Examiner*—Larry N. Anagnos
*Attorney, Agent, or Firm*—Richard E. Bee

[57] ABSTRACT

Improved tristate control circuitry is provided for a driver circuit formed on an integrated circuit chip. A parallel-connected combination of a depletion mode transistor and an enhancement mode transistor is connected in series in the voltage supply path for the driver circuit for controlling whether the driver circuit is in an active mode or a standby mode by controlling the supplying of operating voltage thereto. A further enhancement mode transistor provides a shunting action between the driver circuit side of the parallel-connected transistors and circuit ground to further aid in the control of the driver circuit operating mode.

10 Claims, 1 Drawing Figure

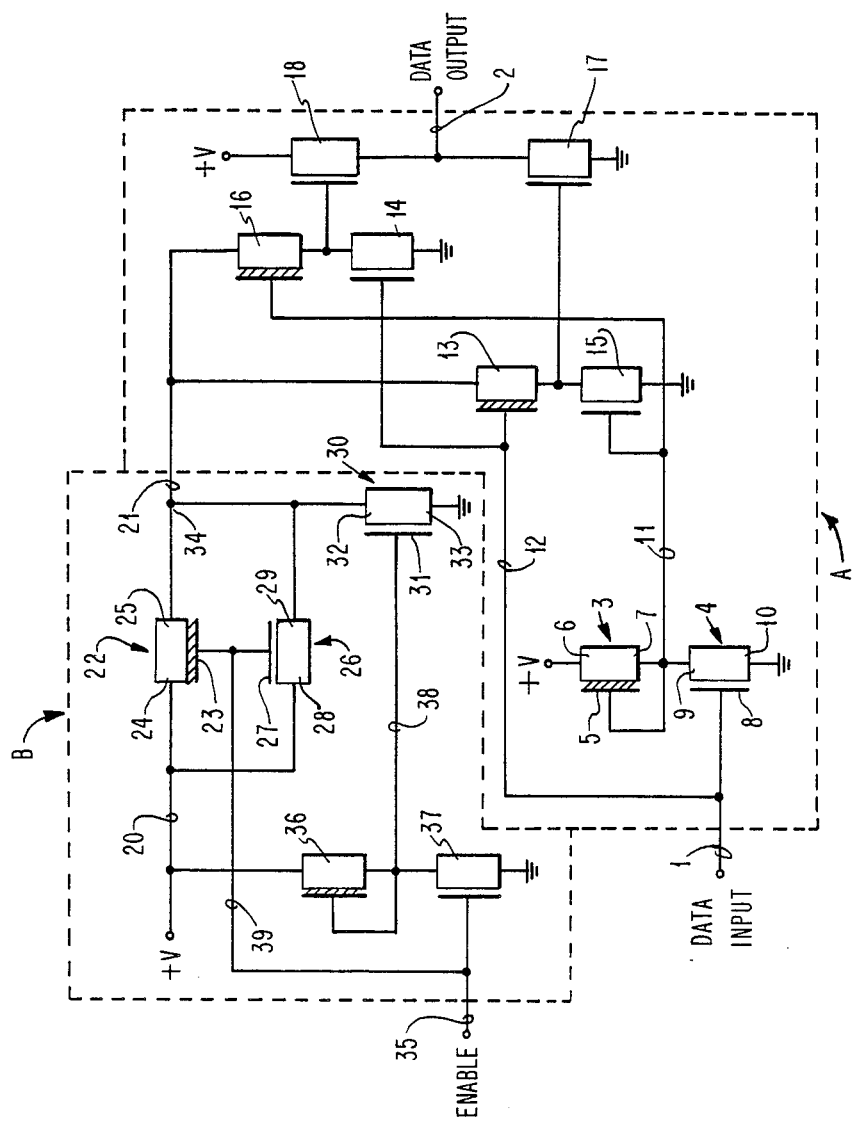

TRISTATE DRIVER CIRCUIT WITH LOW STANDBY POWER CONSUMPTION

DESCRIPTION

1. Technical Field

This invention relates to tristate driver circuits formed on integrated circuit chips

2. Background Art

Driver circuits are formed on integrated circuit chips for driving bus lines and signal lines located off of the chip. As such, they must be capable of supplying a sufficient amount of driving current to the off-chip bus line or signal line. In many applications, it is desirable that the driver circuit be of the tristate type. A tristate driver circuit has a tristate or standby mode wherein the circuit provides a high impedance condition at the output terminal which is to be connected to the off-chip bus line or signal line. Various forms of tristate driver circuits have been heretofore proposed. In general, they suffer from the disadvantage that they dissipate a significant amount of power when in the tristate or standby mode. Another disadvantage of proposed tristate driver circuits is that they are too slow acting when switching from the standby mode to the active mode.

SUMMARY OF INVENTION

This invention provides improved tristate control circuitry for a driver circuit formed on an integrated circuit chip. This improved control circuitry provides a substantial reduction in the power dissipated when in the tristate or standby mode. This control circuitry also provides improved performance in the switching of the driver circuit back to the active or enabled mode. These advantages are accomplished by using in series in the voltage supply path for the driver circuit the parallel-connected combination of an enhancement mode transistor and a depletion mode transistor as a primary mechanism for providing the tristate control action. The physical dimensions of these parallel-connected transistors are proportioned so that the enhancement mode transistor will bring the driver circuit operating voltage up close to the desired value in a very rapid manner and the depletion mode transistor will complete the action of bringing such operating voltage to the desired value. As such, the depletion mode transistor is of sufficiently small size so as to keep the power loss associated therewith to a minimum when in the standby mode.

For a better understanding of the present invention, together with other and further advantages and features thereof, reference is made to the following description taken in connection with the accompanying drawing, the scope of the invention being pointed out in the appended claims.

BRIEF DESCRIPTION OF THE DRAWING

The drawing is a schematic circuit diagram of a tristate driver circuit having improved tristate control circuitry constructed in accordance with the present invention.

DESCRIPTION OF THE PREFERRED EMBODIMENT

All of the circuitry shown in the drawing is formed on an integrated circuit chip and is used for purposes of enabling signals to be supplied from the chip to signal conductors and circuits located off of the chip. For the case of chips used in computers, the chip will normally include a large number of other circuits for performing various other functions. It will also typically include a goodly number of driver circuits, like the one shown in the drawing, for individually driving a goodly number of external or off-chip signal conductors, bus lines, and the like.

The transistors shown in the illustrated embodiment are n-channel metal-oxide-semiconductor (MOS) field-effect transistors (FET's). As such, each transistor includes source, drain and gate electrodes. The gate electrode will sometimes be referred to herein and in the appended claims as the control electrode. The current flow path from the drain electrode to the source electrode within the transistor will sometimes be referred to herein and in the appended claims as the conduction path of the transistor. As is known, the amount of voltage applied to the gate electrode controls the amount of current flow through this conduction path.

Circuit section A of the drawing is a push-pull driver circuit and circuit section B is the improved tristate control circuitry constructed in accordance with the present invention. Considering first the driver circuit A, its purpose is to receive binary data signals at an input terminal 1 and to reproduce such signals at an output terminal 2 with sufficient power to drive an off-chip signal conductor or bus line. Thus, input terminal 1 is connected to some other circuit on the chip and the off-chip bus line or signal conductor is connected to the output terminal 2. In the present embodiment, the signal appearing at the output terminal 2 is an inverted replica of the signal supplied to the input terminal 1.

The binary data signal at terminal 1 is supplied to an inverter circuit formed by transistors 3 and 4. Transistor 3 is a depletion mode transistor having a gate electrode 5, a drain electrode 6 and a source electrode 7. As is known, a depletion mode transistor is on or conductive with zero gate voltage applied and a negative gate voltage is required to turn it off. Transistor 4, on the other hand, is an enhancement mode transistor and has a gate electrode 8, a drain electrode 9 and a source electrode 10. As is known, an enhancement mode transistor is off or non-conductive with zero gate voltage applied. A positive gate voltage greater than the cutoff or threshold value is required to turn it on or render it conductive.

In the configuration shown, transistor 4 provides the basic inverting action, while transistor 3 provides a pull-up function to pull the output line 11 up to the positive supply voltage value +V when the lower transistor 4 is turned off. The fact that the source electrode 7 of transistor 3 is tied back to its gate electrode 5 means that the gate electrode 5 can never go negative and hence the transistor 3 will always be turned on. In the configuration shown, transistor 3 functions much like a pull-up resistor.

When the binary data signal at input terminal 1 is at a low level (near zero volts), transistor 4 is turned off and transistor 3 pulls the inverter circuit output line 11 up to a high level (a positive voltage of a few volts). Conversely, when the binary input signal is at a high level, transistor 4 is turned on and pulls the inverter output line 11 down to a low level near zero volts. Thus, the binary signal on line 11 is an inverted replica of the binary signal at input terminal 1.

Assuming for the time being that the driver circuit A is in an active or enabled condition and considering first the case where the binary data signal at terminal 1 is at a high level, this high level is supplied by way of conductor 12 to increase the current conduction in a depletion mode transistor 13 and to turn on an enhancement mode transistor 14. At the same time, the binary input signal is supplied to the inverter circuit formed by transistors 3 and 4 to produce a low signal level on the inverter output line 11. This turns off an enhancement mode transistor 15 and decreases the current conduction in a depletion mode transistor 16. The increased conduction in transistor 13 and the off condition of transistor 15 produces a high level at the gate electrode of an output transistor 17. This turns on the output transistor 17. At the same time, the reduced conduction in transistor 16 and the on condition of transistor 14 produces a low level at the gate electrode of an output transistor 18. This turns off the output transistor 18. The on condition of transistor 17 and the off condition of transistor 18 places the output terminal 2 at a low level. This low level is the inverse of the high level then occurring at the input terminal 1.

Assuming now that the binary data signal at input terminal 1 is instead at the low level, then the conditions of transistors 13–18 are reversed. In particular, conduction in transistor 13 is reduced and transistor 15 is turned on, which conditions serve to turn off the lower output transistor 17. At the same time, conduction in transistor 16 is increased and the transistor 14 is turned off, to thereby turn on the upper output transistor 18. This places the output terminal 2 at a high signal level which is, of course, the opposite of the low signal level then occurring at the input terminal 1. In this manner, the driver circuit A produces inverted replicas of the data signals supplied to the input terminal 1.

The active gate drive of the depletion transistors 13 and 16 serves to improve the performance of the driver circuit A.

Considering now the improved tristate control circuitry B, such circuitry includes a voltage supply path for supplying operating voltage to the driver circuit A. This voltage supply path includes conductors 20 and 21 which serve to supply the +V supply voltage or operating voltage to the drain electrodes of the depletion transistors 13 and 16. The voltage supply return path is by way of circuit ground represented by the various ground symbols shown in the drawing.

The improved tristate control circuitry B also includes a depletion mode transistor 22 having a conduction path and a control electrode with the conduction path being connected in series in the voltage supply path provided by conductors 20 and 21. Transistor 22 has a gate electrode 23, a drain electrode 24 and a source electrode 25. The gate electrode 23 is the control electrode and the conduction path is the internal current flow path between the drain electrode 24 and the source electrode 25.

The improved tristate control circuitry B further includes a first enhancement mode transistor 26 having a conduction path and a control electrode with the conduction path being connected in series in the voltage supply path 20, 21 and in parallel with the conduction path of the depletion mode transistor 22. This first enhancement mode transistor 26 has a gate electrode 27, a drain electrode 28 and a source electrode 29. The gate electrode 27 is the control electrode and the conduction path is the internal current flow path between the drain electrode 28 and the source electrode 29.

Also included in the improved tristate control circuitry B is a second enhancement mode transistor 30 having a control electrode represented by a gate electrode 31 and a conduction path represented by the internal current flow path between a drain electrode 32 and a source electrode 33. One end of the drain-source conduction path, namely, the end represented by drain electrode 32, is connected to the voltage supply path 20, 21 at a point 34 intermediate the parallel-connected transistors 22 and 26 and the driver circuit A. The other end of the drain-source conduction path in transistor 30, namely, the lower end represented by source electrode 33, is connected to a voltage supply return path represented by the circuit ground symbol connected to the source electrode 33.

The improved tristate control circuitry B further includes binary signal receiving circuitry coupled to the control (gate) electrodes of the transistors 22, 26 and 30 and responsive to a binary control signal supplied to a control signal input terminal 35 for either enabling or disabling the operation of the driver circuit A, depending on the signal level of such binary control signal. This binary signal receiving circuitry includes an inverter circuit formed by depletion transistor 36 and enhancement transistor 37 for inverting the binary signal level supplied to a first circuit point represented by conductor 38 relative to the binary signal level at a second circuit point represented by conductor 39. The first circuit point represented by conductor 38 is connected to the control (gate) electrode 31 of the second enhancement mode transistor 30. The second circuit point represented by conductor 39 is connected to the control (gate) electrodes 23 and 27 of the parallel-connected transistors 22 and 26. Conductor 39 is also connected directly to the control signal input terminal 35.

Because of the inverting action provided by transistors 36 and 37, the control signal level at the gate 31 of transistor 30 is always the opposite of the control signal level at the gates 23 and 27 of the parallel-connected transistors 22 and 26. This inverter circuit provided by transistors 36 and 37 functions in the same manner as described above for the inverter circuit formed by transistors 3 and 4 in the driver circuit A.

When the binary control signal at control terminal 35 is high (the "Enable" driver level), conduction in the parallel-connected transistors 22 and 26 is increased and conduction in the second enhancement transistor 30 is decreased to supply the desired operating voltage to the driver circuit A. More particularly, a high level at the control terminal 35 increases conduction in the depletion mode transistor 22, turns on the enhancement mode transistor 26, and turns off the enhancement mode transistor 30. This brings the node or circuit point 34 in the voltage supply path up to very nearly the full supply voltage value of +V. This provides good drive current through the driver circuit depletion transistors 13 and 16 to drive the appropriate output transistors 17 and 18 in the desired manner for reproducing at the driver circuit output terminal 2 the inverted replica of the data signal supplied to the driver circuit input terminal 1.

When the binary control signal at the control terminal 35 is at a low level, the driver circuit A is disabled and its output terminal 2 is placed in a high impedance (tristate) condition. This low signal level at control terminal 35 reduces conduction in the parallel-connected transistors 22 and 26 and increases conduction in the second enhancement mode transistor 30 to effectively disconnect the supply voltage source +V from the depletion transistors 13 and 16 in the driver circuit A. More particularly, this low signal level at control terminal 35 substantially reduces conduction in the depletion mode transistor 22, turns off the enhancement mode transistor 26, and turns on the enhancement mode transistor 30. This brings the node 34 in the voltage supply path down to a low voltage value near zero. This turns off the driver circuit depletion transistors 13 and 16 because there is no longer sufficient current drive to support conduction in these transistors 13 and 16. This removes the gate drive from both of the output transistors 17 and 18 and hence renders both of these output transistors 17 and 18 non-conductive. This places the driver circuit output terminal 2 at a high impedance condition. Since, at this time, the transistors 13-18 in the driver circuit A are nonconductive, the data signal appearing at input terminal 1 is prevented from reaching or otherwise affecting the output terminal 2.

A feature of the improved tristate control circuitry B is the very fast speed at which the driver circuit A is returned to an operating or enabled condition when switching from the disabled or standby condition to the enabled condition. This very fast turn on action results from the use of the parallel-connected depletion and enhancement transistors 22 and 26 and in the manner of their construction. In particular, these transistors 22 and 26 are constructed so that the physical width of the current conduction path in the enhancement transistor 26 is relatively wide and the physical width of the current conduction path in the depletion transistor 22 is relatively narrow. Thus, the current carrying capacity of the conduction path in enhancement transistor 26 is substantially greater than the current carrying capacity of the conduction paths in the depletion transistor 22. By conduction path is meant the path electrical current follows when flowing from the drain electrode to the source electrode within each of these transistors.

When switching from the disabled or standby mode to the enabled or active mode, the bulk of the current is supplied by the larger enhancement transistor 26 to very rapidly bring the voltage supply point 34 up to about 70 percent of the $+V$ value. Its internal drain-to-source voltage drop prevents it from going any higher. The smaller depletion transistor 22 then takes over to bring the voltage supply point 34 up to very nearly the full $+V$ value.

It has been found that very good performance can be obtained by making the effective width of the conduction path in the enhancement transistor 26 approximately 100 micrometers and by making the effective width of the conduction path in the depletion transistor 22 approximately 15 micrometers. These values provide fast switching to the active mode and provide a very low power dissipation when in the disabled or standby mode.

A further feature of the present invention is that a tristate driver circuit is provided which has very low power dissipation when in the disabled or standby mode. In particular, in this standby or tristate mode, all of the larger current carrying transistors in the driver circuit A, namely, transistors 13-18, are turned off. Also, because of its relatively small size, the current flow through the depletion transistor 22 in the voltage supply path is very small when in the standby mode. With the conduction path dimensions set forth above for the parallel-connected transistors 22 and 26, it has been found that the power dissipation for the illustrated driver circuit, when in the standby mode, is less than 3 milliwatts.

While there has been described what is at present considered to be a preferred embodiment of this invention, it will be obvious to those skilled in the art that various changes and modifications may be made therein without departing from the invention, and it is, therefore, intended to cover all such changes and modifications as fall within the true spirit and scope of the invention.

What is claimed is:

1. Improved tristate control circuitry for a driver circuit formed on an integrated circuit chip comprising:
   a voltage supply path for supplying operating voltage to the driver circuit;
   a depletion mode transistor having a conduction path and a control electrode with the conduction path being connected in series in the voltage supply path;
   a first enhancement mode transistor having a conduction path and a control electrode with the conduction path being connected in series in the voltage supply path and in parallel with the conduction path of the depletion mode transistor;
   a second enhancement mode transistor having a conduction path and a control electrode with the conduction path having one end connected to the voltage supply path intermediate the parallel-connected transistors and the driver circuit and having the other end connected to a voltage supply return path; and
   binary signal receiving circuitry coupled to the control electrodes of the transistors and responsive to a first binary signal level for reducing conduction in the parallel-connected depletion mode and first enhancement mode transistors and increasing conduction in the second enhancement mode transistor to disable the driver circuit and place same in a high impedance output condition and responsive to a second binary signal level for increasing conduction in the parallel-connected transistors and reducing conduction in the second enhancement mode transistor to enable the driver circuit to pass signals from its input to its output.

2. Improved tristate control circuitry in accordance with claim 1 wherein the transistors are field-effect transistors.

3. Improved tristate control circuitry in accordance with claim 1 wherein the transistors are metal-oxide-semiconductor type field-effect transistors.

4. Improved tristate control circuitry in accordance with claim 1 wherein each transistor is a field-effect transistor having source, drain and gate electrodes, the gate electrode being the control electrode and the conduction path being the path between the source and drain electrodes.

5. Improved tristate control circuitry in accordance with claim 1 wherein the physical dimensions of the conduction path in the first enhancement mode transistor are such that such conduction path has a substantially greater current carrying capacity than does the conduction path in the depletion mode transistor.

6. Improved tristate control circuitry in accordance with claim 1 wherein the physical width of the conduction path in the first enhancement mode transistor is substantially greater than the physical width of the conduction path in the depletion mode transistor.

7. Improved tristate control circuitry in accordance with claim 1 wherein the first enhancement mode transistor has a relatively wide conduction path and wherein the depletion mode transistor has a relatively narrow conduction path.

8. Improved tristate control circuitry in accordance with claim 1 wherein the effective width of the conduction path in the first enhancement mode transistor is approximately 100 micrometers and the effective width of the conduction path in the depletion mode transistor is approximately 15 micrometers.

9. Improved tristate control circuitry in accordance with any one of claims 5, 6, 7 and 8 wherein each transistor is a field-effect transistor having source, drain and gate electrodes and wherein each conduction path is the path electrical current follows when flowing from one to the other of the source and drain electrodes.

10. Improved tristate control circuitry in accordance with claim 1 wherein the binary signal receiving circuitry includes an inverter circuit for inverting the binary signal level supplied to a first circuit point relative to the binary signal level at a second circuit point, where one of these circuit points is connected to the control electrode of the second enhancement mode transistor and the other of these circuit points is connected to the control electrodes of the parallel-connected transistors.

* * * * *